(12) United States Patent
Azzouz et al.

(10) Patent No.: US 10,559,739 B2
(45) Date of Patent: Feb. 11, 2020

(54) THERMOELECTRIC MODULE FOR A THERMOELECTRIC GENERATOR

(71) Applicant: Valeo Systemes Thermiques, Le Mesnil Saint Denis (FR)

(72) Inventors: Kamel Azzouz, Paris (FR); Issiaka Traore, Courbevoie (FR)

(73) Assignee: Valeo Systemes Thermiques, Le Mesnil Saint Denis (FR)

(*) Notice: Subject to any disclaimer, the term of this patent is extended or adjusted under 35 U.S.C. 154(b) by 174 days.

(21) Appl. No.: 15/754,672

(22) PCT Filed: Jul. 25, 2016

(86) PCT No.: PCT/EP2016/067648
§ 371 (c)(1),
(2) Date: Jul. 19, 2018

(87) PCT Pub. No.: WO2017/032526
PCT Pub. Date: Mar. 2, 2017

(65) Prior Publication Data
US 2018/0358534 A1    Dec. 13, 2018

(30) Foreign Application Priority Data
Aug. 25, 2015  (FR) ..................... 15 57913

(51) Int. Cl.
H01L 35/30  (2006.01)
H01L 35/32  (2006.01)
F01N 5/02   (2006.01)

(52) U.S. Cl.
CPC ............. H01L 35/32 (2013.01); F01N 5/025 (2013.01); H01L 35/325 (2013.01); F01N 2470/24 (2013.01); H01L 35/30 (2013.01)

(58) Field of Classification Search
CPC ............................ H01L 35/32; F01N 2470/24
USPC ........................................................ 136/209
See application file for complete search history.

(56) References Cited

U.S. PATENT DOCUMENTS

2006/0180192 A1* 8/2006 Sharp ..................... H01L 23/38
                                                        136/224

FOREIGN PATENT DOCUMENTS

DE   10 2009 003144 A1   11/2010
EP   2 541 634 A1        1/2013

OTHER PUBLICATIONS

International Search Report of the International Searching Authority issued in PCT/EP2016/067648 dated Sep. 1, 2016 (2 pages).
Witten Opinion of the International Searching Authority issued in PCT/EP2016/067648 dated Sep. 1, 2016 (5 pages).

* cited by examiner

Primary Examiner — Angelo Trivisonno
(74) Attorney, Agent, or Firm — Osha Liang LLP

(57) ABSTRACT

A thermoelectric module comprising a central thermoelectric assembly of cylindrical tubular shape inside which a first cold fluid flows and outside which a hot fluid flows.
This module is characterized in that it also comprises at least one peripheral thermoelectric assembly having:
an outer face in contact with a second cold fluid;
an inner face positioned on a peripheral boundary surrounding the central thermoelectric assembly, said boundary defining a channel between said central and peripheral thermoelectric assemblies where the hot fluid flows.

14 Claims, 5 Drawing Sheets

THERMOELECTRIC MODULE FOR A THERMOELECTRIC GENERATOR

FIELD OF THE INVENTION

The invention relates to a thermoelectric module, a thermoelectric device comprising an arrangement of a plurality of thermoelectric modules, and a thermoelectric generator comprising at least one thermoelectric device.

PRIOR ART

In the motor vehicle field, generators comprising a plurality of thermal modules using thermoelectric elements that make it possible to produce an electric current in the presence of a temperature gradient between two of their opposite faces, in accordance with the phenomenon known under the name of the Seebeck effect, have already been proposed. These modules comprise a stack of first tubes, intended for the flow of exhaust gases from an engine, and of second tubes, intended for the flow of a heat transfer fluid of a cooling circuit. Thermoelectric elements are sandwiched between the tubes so as to be subjected to a temperature gradient arising from the difference in temperature between the hot exhaust gases and the cold cooling fluid.

Such generators are particularly beneficial as they make it possible to produce electricity on the basis of a conversion of the heat arising from the exhaust gases from the engine. They thus offer the possibility of reducing the fuel consumption of the vehicle by acting as a substitute, at least partially, for the alternator that is usually provided in said vehicle in order to generate electricity using a belt that is driven by the crankshaft of the engine.

Thermoelectric elements are conventionally distinguished between those of parallelepipedal and cylindrical shape.

For a thermoelectric module comprising parallelepipedal thermoelectric elements, the hot gas passes through the channel of a flat tube made of stainless steel. It then exchanges heat with the pads whose opposite surfaces are in contact with a cold liquid source. The connections between the thermoelectric pads are made alternately between the upper and lower faces by virtue of planar, soldered or adhesively bonded conductive tracks.

For a thermoelectric module comprising cylindrical thermoelectric elements in the shape of a ring, the cold water flows inside a tube passing through the rings, and the hot gas is conveyed externally. This configuration makes it possible to rebalance the transfers of heat on the cold side and the hot side. Specifically, with such a configuration, the heat exchange surface on the hot side is larger, thereby improving the transfer of heat to the rings, with knowledge that the coefficient of exchange on the hot gas side is lower than on the cold liquid side. The connections between the rings are made alternately on the inside and then on the outside of the rings by way of tubular conductive links acting as metal electrodes.

Cylindrical geometry is preferred to parallelepipedal geometry in terms of heating efficiency, as explained above.

The objective of the present invention is that of further improving this heating efficiency, by optimizing the exchange surfaces.

SUMMARY OF THE INVENTION

This aim is achieved by virtue of a thermoelectric module comprising, as is conventional, a central thermoelectric assembly of cylindrical tubular shape inside which a first cold fluid flows and outside which a hot fluid flows.

This module is characterized mainly in that it also comprises at least one peripheral thermoelectric assembly having:
- an outer face in contact with a second cold fluid;
- an inner face positioned on a peripheral boundary surrounding the central thermoelectric assembly, said boundary defining a channel between said central and peripheral thermoelectric assemblies where the hot fluid flows.

The main idea of this invention is that of integrating not just a single thermoelectric assembly but a plurality of thermoelectric assemblies arranged so as to draw calories from one and the same hot fluid at the same time. The recovery of energy from this hot fluid is therefore optimized.

The module comprises a single peripheral thermoelectric assembly positioned continuously on the peripheral boundary.

In this case, the idea is that of 'densifying' the thermoelectric module, by integrating a second thermoelectric assembly, with a large diameter, around the central first thermoelectric assembly, for the purpose of trapping all of the heat given off by the hot fluid, that is to say the gas. Thus, the hot fluid flows at the same time outside the central first thermoelectric assembly, on the one hand, and inside the peripheral second thermoelectric assembly, on the other hand.

In this configuration, various embodiments of the module of the invention, as described hereinafter, may be taken together or separately:
- the central thermoelectric assembly is situated inside the peripheral thermoelectric assembly.
- said peripheral thermoelectric assembly is of cylindrical tubular shape that is parallel and concentric with the central thermoelectric assembly.
- said central and peripheral thermoelectric assemblies are each formed by an alignment of thermoelectric elements of annular shape that are linked electrically to one another and able to generate an electric current under the action of a temperature gradient exerted between two of their faces.
- said channel inside which the hot fluid flows has an annular cross section.
- the module comprises an insulating tube that is concentric with the central and peripheral thermoelectric assemblies and surrounds the peripheral thermoelectric assembly while at the same time defining a channel with an annular cross section for the flow of the second cold fluid around the peripheral thermoelectric assembly.
- the channel in which the hot fluid flows comprises means for disrupting the flow of the hot fluid in order to improve the exchange of heat.
- said means for disrupting the flow of the hot fluid consist of fins that are positioned within the channel for the flow of the hot fluid and extend from the outer face of the central thermoelectric assembly and from the inner face of the peripheral thermoelectric assembly.
- said fins extending from the central and peripheral thermoelectric assemblies are positioned in a quincunx.
- the central and peripheral thermoelectric assemblies are linked electrically in parallel.

The invention also relates to a thermoelectric device comprising an arrangement of a plurality of thermoelectric modules such as described above. These thermoelectric modules may be positioned in a line or in a quincunx, for example.

The invention also relates to a thermoelectric generator comprising at least one thermoelectric device such as described above.

PRESENTATION OF THE FIGURES

The invention will be better understood, and other aims, details, features and advantages thereof will become clearer from the following detailed explanatory description of at least one embodiment of the invention, provided by way of purely illustrative and non-limiting example, with reference to the appended schematic drawings.

DETAILED DESCRIPTION

Figure 1:
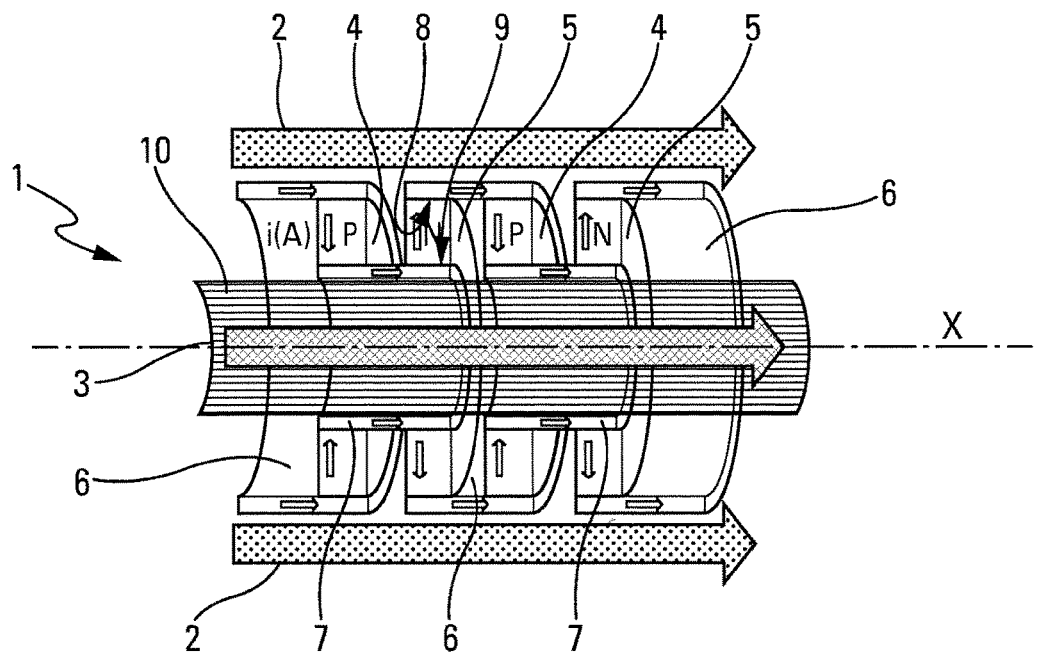
FIG. 1 illustrates a thermoelectric module with cylindrical geometry, in a longitudinal sectional view, according to the prior art.

FIG. 1 illustrates an example of a conventional thermoelectric module 1.

This module in this case comprises a first channel 2 able to allow a hot fluid, in particular exhaust gases from an engine, to flow, and a second channel 3 able to allow a cold fluid, in particular a heat transfer fluid of a cooling circuit, with a temperature lower than that of the hot fluid, to flow. This cold fluid flows within a tube 10 with a central axis X.

The module 1 comprises a plurality of thermoelectric elements 4, 5, in this case of annular shape, that are able to generate an electric current under the action of a temperature gradient exerted between two of their faces, one face 8, termed first active face, being defined by an outer cylindrical peripheral surface, and the other face 9, termed second active face, being defined by an inner cylindrical peripheral surface. Said first and second faces 8, 9 have for example circular cross sections. More generally, any cross section of round and/or polygonal shape is possible.

Such elements 4, 5 operate, in accordance with the Seebeck effect, by making it possible to create an electric current in an electrical connector 6, 7 connected between said faces 8, 9 that are subjected to the temperature gradient. In a manner known to those skilled in the art, such elements 4, 5 are formed, for example, of bismuth and tellurium (Bi2Te3).

The thermoelectric elements 4, 5 may be, for a first portion, elements 4 of a first type, termed P, that make it possible to establish an electrical potential difference in one direction, termed positive direction, when they are subjected to a given temperature gradient, and, for the other portion, elements 5 of a second type, termed N, that make it possible to create an electrical potential difference in an opposite direction, termed negative direction, when they are subjected to the same temperature gradient.

The thermoelectric elements 4, 5 shown in all of the figures are formed of a one-piece ring. However, they may be formed of a plurality of pieces each forming an angular portion of the ring.

In FIG. 1, said thermoelectric elements 4, 5 are positioned, for example, in the longitudinal extension of one another, in particular coaxially along the axis X; they alternate between elements P and elements N. They are in particular of identical dimensions and sizes. However, they may have a thickness, that is to say a dimension between their two planar faces, that is different from one type to another, in particular depending on their electrical conductivity.

Said thermoelectric elements 4, 5 are for example grouped in pairs, each pair being formed of one said thermoelectric element 4 of P type and one said thermoelectric element 5 of N type, and said module 1 is configured to allow current to flow between the first active faces 8 of the thermoelectric elements of one and the same pair and current to flow between the second active faces 9 of each of the thermoelectric elements of said same pair and the adjacent thermoelectric element of the adjacent pair. It is thus ensured that the electric current flows in series between the thermoelectric elements 8, 9 that are positioned next to one another, as illustrated by the small arrows.

The module 1 furthermore comprises connectors 6, 7 between the first and second thermoelectric elements 4, 5. These connectors 6, 7 are in the form of a ring with a central axis X. A ring of a first type 6 is systematically provided between a thermoelectric element 5 of N type and a thermoelectric element 4 of P type. A ring of a second type 7 is systematically provided between a thermoelectric element 4 of P type and a thermoelectric element 5 of N type.

Said rings 6, 7 differ in terms of their diameter. Thus, the ring 6 provided between a thermoelectric element 5 of N type and a thermoelectric element 4 of P type will have a diameter larger than the ring 7 provided between said thermoelectric element 4 of P type and the following thermoelectric element 5 of N type.

In other words, for the thermoelectric module 1, two sets of rings 6, 7 of different sizes are necessary: a first one for the electrical link on the side of the channel 3 for the cold source and a second one, with a larger diameter, for the side of the channel 2 for the hot source.

Figure 2:
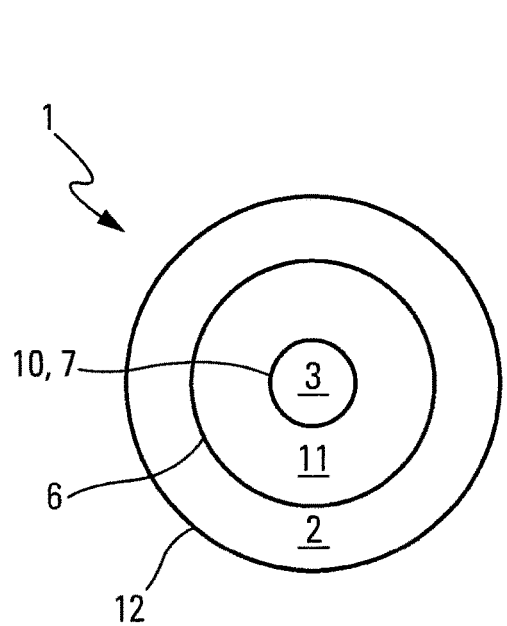
FIG. 2 illustrates the thermoelectric module of FIG. 1 in a cross-sectional view.

In summary, this thermoelectric module 1 according to the prior art, in a cross-sectional view in FIG. 2, is formed of the following elements, from the inside to the outside:

a channel 3 for the flow of a cold fluid, delineated by a tube 10 a central thermoelectric assembly 11 formed by the thermoelectric elements 4, 5 surrounded by inner 7 and outer 6 electrodes a channel 2 for the flow of a hot fluid, delineated by a tube 12

Figure 3:
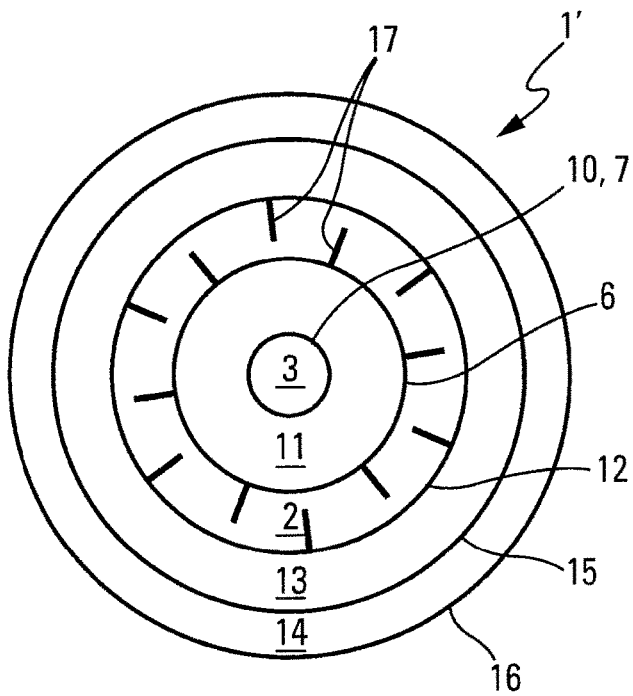
FIG. 3 shows a thermoelectric module according to a first mode that highlights the invention, in a cross-sectional view.

The thermoelectric module 1' according to a first embodiment of the invention, in a cross-sectional view in FIG. 3, is formed of the following elements, from the inside to the outside:

a channel 3 for the flow of a first cold fluid, delineated by a tube 10 a central thermoelectric assembly 11 formed by the thermoelectric elements 4, 5 surrounded by inner electrodes 7 and outer electrodes 6 a channel 2 for the flow of a hot fluid a peripheral thermoelectric assembly 13 formed by thermoelectric elements surrounded by inner 12 and outer 15 electrodes a channel 14 for the flow of a second cold fluid, delineated by a tube 16 that is preferably insulating.

This module 1' corresponds to the module 1 from the prior art, to which a peripheral thermoelectric assembly 13 with its inner 12 and outer 15 electrodes is added. There is therefore a second layer of thermoelectric elements, able to draw calories from the same hot fluid. The thermoelectric module 1' is thus 'densified', and optimizes the transfer of heat.

More precisely, the channels 3, 2, 14, the electrodes 7, 6, 12, 15 and the thermoelectric assemblies 11, 13 are all concentric with respect to the axis X. As a result, the channels for the flow of the hot fluid 2 and of the second cold fluid 14 have cross sections of annular shape.

The central 11 and peripheral 13 thermoelectric assemblies are thus positioned thermally in parallel, and are also linked electrically in parallel.

The two thermoelectric assemblies 11, 13 are formed of annular thermoelectric elements, arranged next to one another so as to form hollow tubes. The thermoelectric elements of the central assembly 11 have a diameter smaller than the thermoelectric elements of the peripheral assembly 13. The diameter of the thermoelectric elements of the peripheral assembly 13 is adjusted depending on the electrical resistance of the assembly and depending on the available flow of heat.

The hot fluid is thus trapped between the outer face of the central thermoelectric assembly 11, on the one hand, and a peripheral boundary formed by the inner face of the peripheral thermoelectric assembly 13, on the other hand. The exchange surface has thus more than doubled in comparison with the prior art, giving the module 1' very good performance.

In order to further increase energy efficiency performance, fins 17 are positioned in the channel 2 for the flow of the hot fluid. These fins 17 disrupt the flow of the hot fluid and thus create turbulence, preventing the hot fluid from flowing too fast, in order that the outer face of the central thermoelectric assembly 11 and the inner face of the peripheral thermoelectric assembly 13 have time to capture the calories. These fins 17 also themselves have additional surfaces for exchanging heat with the hot fluid.

Preferably, half of the fins 17 extend from the outer face of the central thermoelectric assembly 11 and the other half of the fins 17 extend from the inner face of the peripheral thermoelectric assembly 13.

The fins 17 are positioned in a quincunx, so as to guide the hot fluid through an undulating or zigzag path. This alternating layout therefore makes it possible to disrupt the flow of the flow and thus improve the exchange of heat.

Figure 4:
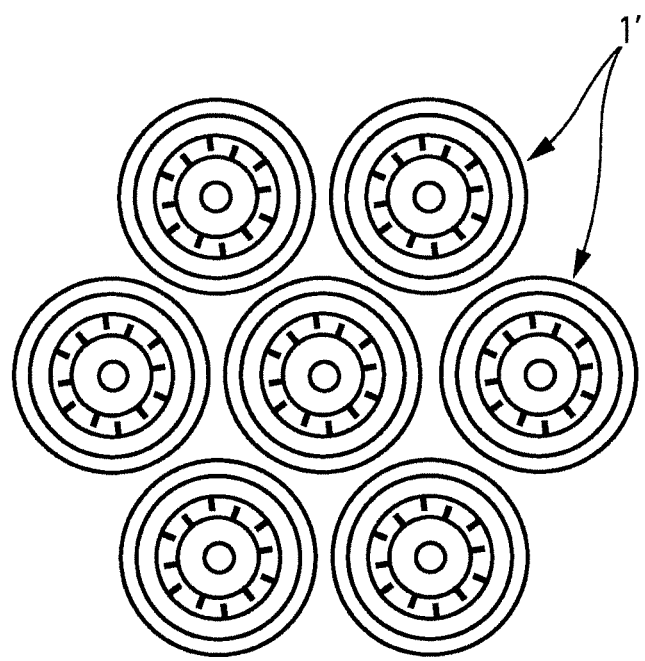
FIG. 4 shows a thermoelectric device formed of an arrangement of thermoelectric modules according to FIG. 3, in a cross-sectional view.

FIG. 4 shows a practical illustration with regard to the layout of the 'densified' thermoelectric modules 1' according to the invention, forming a thermoelectric device used in a generator. In this example, the modules 1' are positioned in a line over three rows, and in a quincunx from one row to another, so as to obtain a compact device. The number of lines may vary, of course, as may the number of modules 1' per line.

Figure 5:
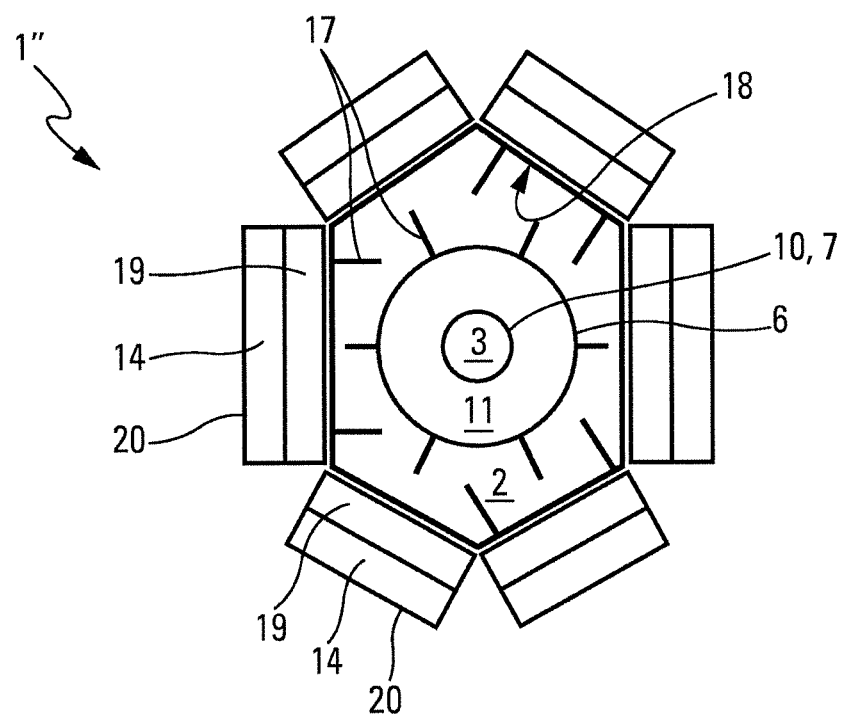
FIG. 5 shows a thermoelectric module according to a second mode that does not highlight the invention, in a cross-sectional view.

The thermoelectric module 1" according to a second embodiment of the invention, which mode does not form part of the invention, in a cross-sectional view in FIG. 5, is formed of the following elements, from the inside to the outside:

a channel 3 for the flow of a first cold fluid, delineated by a tube 10 a central thermoelectric assembly 11 formed by the thermoelectric elements 4, 5 surrounded by inner electrodes 7 and outer electrodes 6 a channel 2 for the flow of a hot fluid, whose peripheral boundary is formed by a tube 18 whose cross section has a plurality of sides;

peripheral thermoelectric assemblies 19 situated on each side of the tube 18;

channels 14 for the flow of a second cold fluid, delineated by tubes 20.

This module 1" corresponds to the module 1 from the prior art, to which a plurality of peripheral thermoelectric assemblies 19 positioned all around the central thermoelectric assembly 11 are added. The module 1" therefore has a star architecture, with a plurality of peripheral thermoelectric assemblies 19 discontinuously surrounding the central thermoelectric assembly 11. Again, there is a second layer of thermoelectric elements, able to draw calories from the same hot fluid. The thermoelectric module 1" is thus 'idensified', and optimizes the transfer of heat.

In the example that is shown, the tube 18 is hexagonal, its axis of symmetry being coincident with the central axis X. The dimension of the tube 18 is adjusted depending on the thermal balance involved in the thermoelectric elements of the module 1".

The module 1" includes six peripheral assemblies 19 each positioned against a side of the tube 18, and over the entire width of the side so as to provide a maximum heat exchange surface with the tube 18.

Thus, only the six edges of the tube 18 are not in contact with a peripheral thermoelectric module 19.

In order to be able to extend over the entire width of the side of the tube 18, each peripheral thermoelectric assembly 19 has a planar inner face with a width equivalent to that of one side of the tube 18. To this end, the peripheral thermoelectric assemblies 19 are formed by an alignment of thermoelectric elements having a parallelepipedal geometry. The hot fluid is thus trapped between the outer face of the central thermoelectric assembly 11, on the one hand, and the hexagonal tube 18 in contact with the inner face of the peripheral thermoelectric assemblies 19, on the other hand. The exchange surface has thus more than doubled in comparison with the prior art, giving the module 1" very good performance.

Through this parallelepipedal geometry, the outer face of the peripheral thermoelectric assemblies 19 is also planar. This outer face exchanges calories with a second cold fluid. Advantageously, this second cold fluid flows in a channel 14 delineated by a flat tube 20 with a rectangular cross section, positioned against said outer face, and the dimensions of which match those of the outer face so as to offer the largest heat exchange surface. The positioning of a flat tube 20 on a peripheral thermoelectric assembly 19 with parallelepipedal geometry makes assembly easy and simple to perform.

Just like in the first embodiment, fins 17 in the form of needles or disruptors are situated in the channel 2 for the flow of the hot fluid so as to create turbulence. These fins/disruptors 17 extend from the hexagonal tube 18 or from the outer face of the central thermoelectric assembly 11, for the purpose of improving and intensifying the exchanges of heat that are beneficial to the efficiency of the thermoelectric elements.

Figure 6:
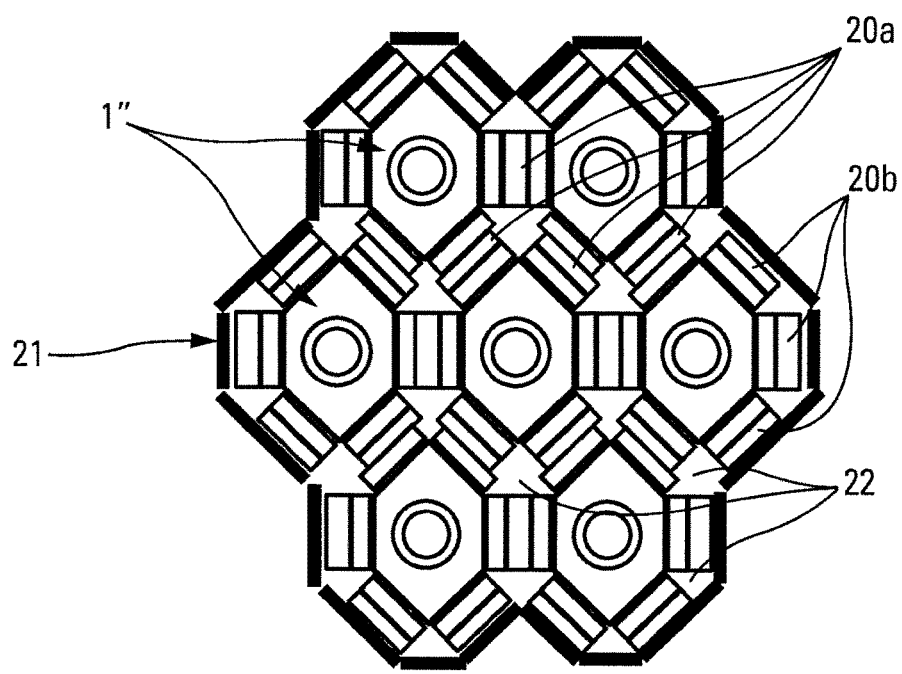
FIG. 6 shows a thermoelectric device formed of an arrangement of thermoelectric modules according to FIG. 5, in a cross-sectional view.

FIG. 6 shows a practical illustration with regard to the layout of the thermoelectric modules 1″ according to this second embodiment, forming a thermoelectric device used in a generator. In this example, the modules 1″ are positioned in a line over three rows, and in a quincunx from one row to another, so as to obtain a compact device having the appearance of a honeycomb, each module 1″ forming a cell. This example is not limiting with regard to the number of modules 1″ per device.

Figures 7, 8, 9:
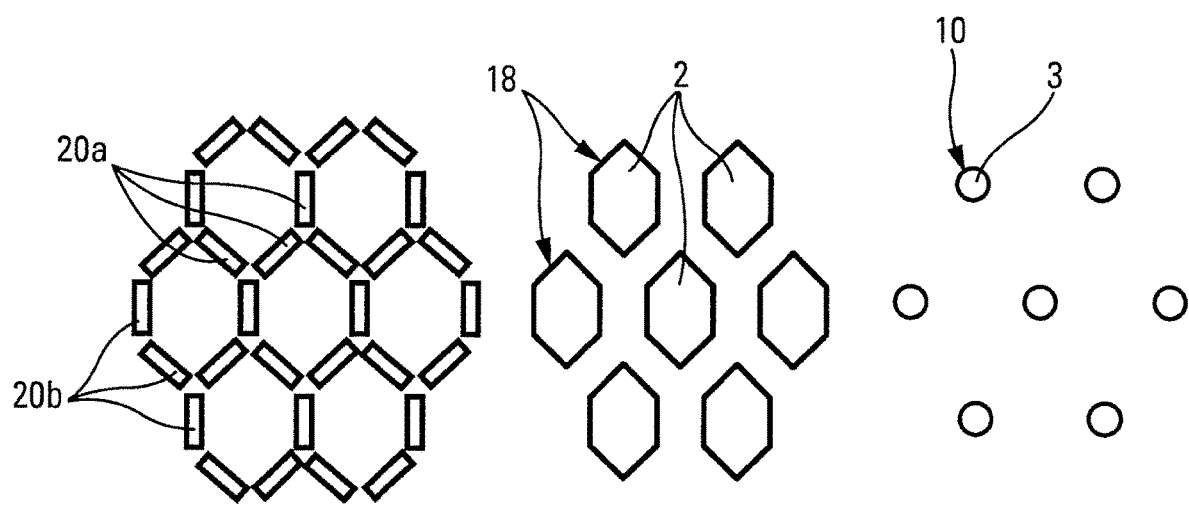
FIG. 7 shows the arrangement of flat tubes for the flow of cold fluid in the thermoelectric device of FIG. 6.
FIG. 8 shows the arrangement of tubes for the flow of hot fluid in the thermoelectric device of FIG. 6.
FIG. 9 shows the arrangement of round tubes for the flow of cold fluid in the thermoelectric device of FIG. 6.

The honeycomb shape of the device is best shown in FIG. 7. Only the flat tubes 20 in which the second cold fluid flows are shown. It is clearly visible that, between two adjacent modules 1″, there is just one flat tube 20a. This flat tube 20a is therefore used for the two modules 1″ at the same time. It has a first planar face directed toward one of the modules 1″, and a second planar face directed toward the other module 1″. There is therefore sharing of the flat tubes 20a in this honeycomb configuration. The non-shared flat tubes 20b are situated at the periphery of the honeycomb.

In each cell there is a hexagonal tube 18 forming the channel 2 for the flow of the hot fluid, as illustrated in FIG. 8, and in each hexagonal tube 18 there is a round tube 10 forming the channel 3 for the flow of the first cold fluid, as illustrated in FIG. 9. There are therefore three different types of tube 10, 18, 20 for distributing fluids in this thermoelectric device.

Between the cells there are triangular spaces, called dead volumes 22, in which the electrical links that link the peripheral thermoelectric assemblies 19 to one another run.

The device is surrounded by an insulating outer shell 21 that matches the outer shape of the honeycomb, thus coming into contact with the flat tubes 20b situated at the periphery of the honeycomb and that are therefore not shared. This shell 21 makes it possible to avoid calories dissipating from the cold fluid to the outside.

This concept of a honeycomb device makes it possible to implement various configurations of exchangers within the thermoelectric generator.

Figure 11:
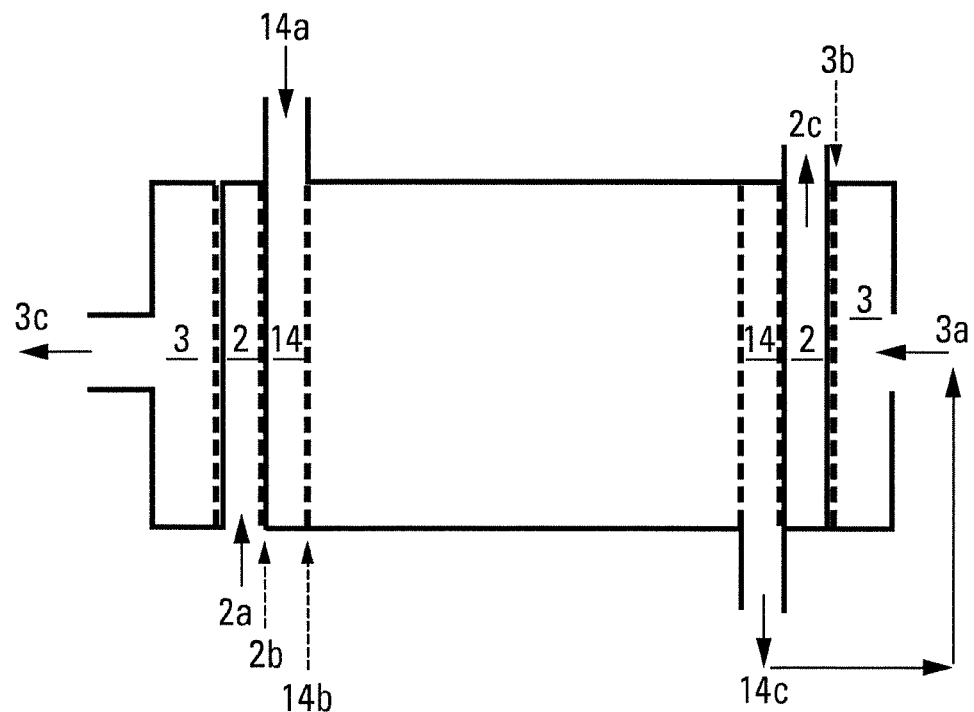
FIG. 11 is a schematic view of an exchanger equipped with a single cold fluid circuit, designed to operate with a thermoelectric device according to the invention.
Figure 12:
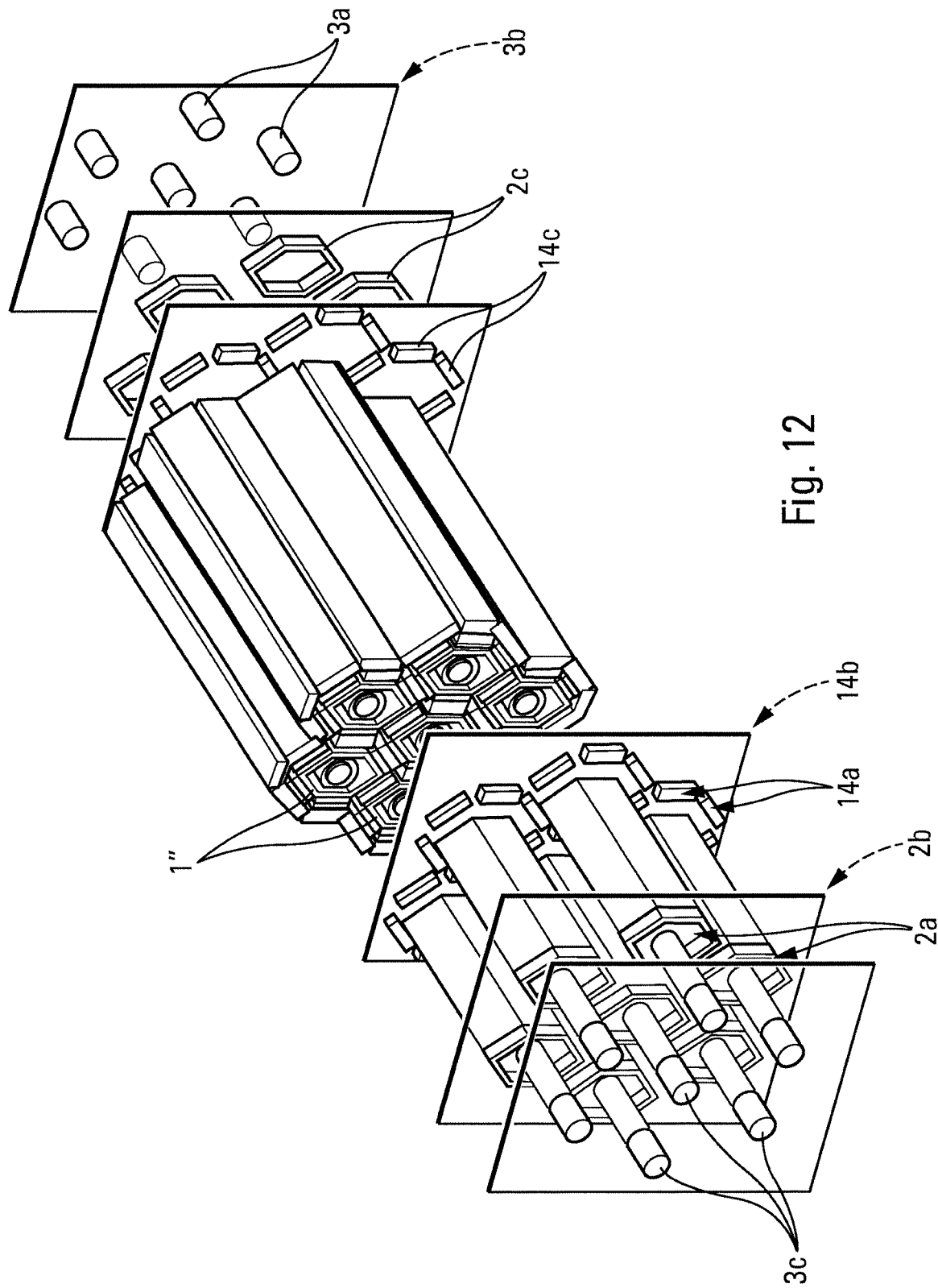
FIG. 12 is an exploded perspective view of a thermoelectric device exchanger assembly according to the invention.

FIG. 12 illustrates various parts of an exchanger with respect to the honeycomb device. This exchanger comprises:
an inlet 3a for the first cold fluid
a zone 3b for distribution of the first cold fluid in the round tubes 10
an outlet 3c for the first cold fluid
an inlet 2a for the hot fluid (gas)
a zone 2b for distribution of the hot fluid in the hexagonal tubes 18
an outlet 2c for the hot fluid
an inlet 14a for the second cold fluid
a zone 14b for distribution of the second cold fluid in the rectangular tubes 20
an outlet 14c for the second cold fluid
These various parts are depicted schematically in FIGS. 10 and 11.

Figure 10:
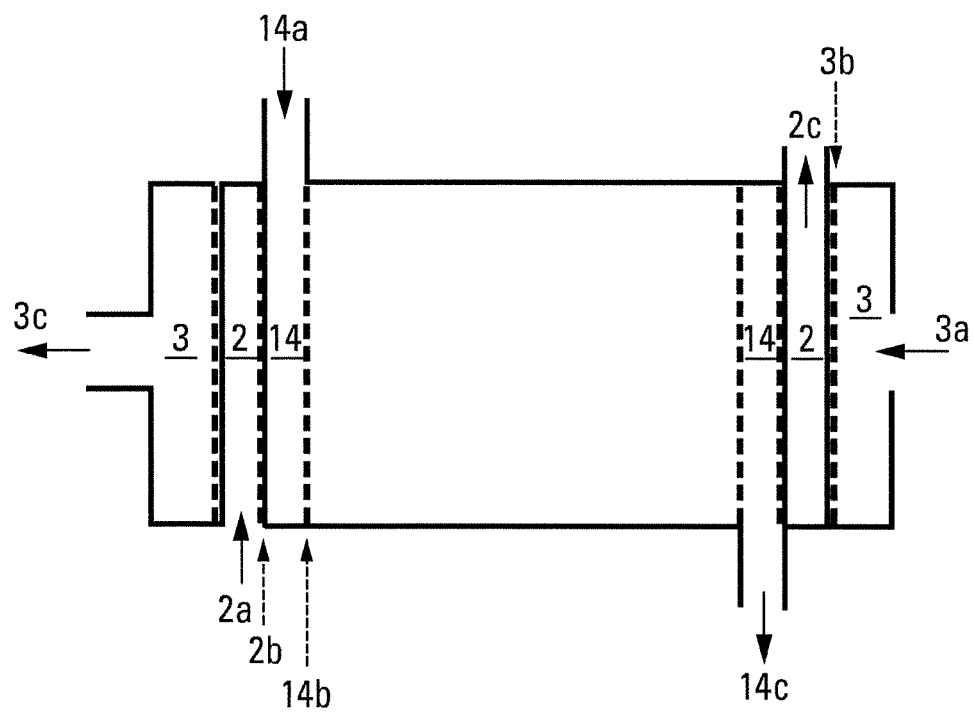
FIG. 10 is a schematic view of an exchanger equipped with two separate cold fluid circuits, designed to operate with a thermoelectric device according to the invention.

In a first example according to FIG. 10, the exchanger has two separate circuits for the flow of the first and second cold fluids. This makes it possible to separately control the flow of heat passing through the central thermoelectric assemblies 11 of cylindrical shape, on the one hand, and the peripheral thermoelectric assemblies 19 of parallelepipedal shape, on the other hand. This type of generator is then called 'three-fluid' as it manages the distribution of three separate fluids, namely the hot fluid and the first and second cold fluids.

In the configuration shown in FIG. 10, the first cold fluid flows in channels 3 in counter-current to the hot fluid in the channels 2, whereas the second cold fluid flows in channels 14 in co-current. However, it is possible to make both cold fluids flow in counter-current to the flow of the hot fluid at the same time.

In a second example according to FIG. 11, the exchanger has a single cold fluid circuit. In this case, the second cold fluid leaving via the outlet 14c is reinjected directly into the inlet 3a for the first cold fluid by virtue of a U-shaped return. The first and the second cold fluids are thus coincident, and consist of just a single cold fluid running in both of the channels 3 and 14.

This cold fluid may thus flow firstly in co-current within the first section, and then secondly in counter-current within the second section, with respect to the flow of the hot fluid. In the two examples, thermal insulation is produced on the round tubes 10 in which the cold fluid flows, precisely at the inlet and outlet zone for the hot fluid in the hexagonal tubes 18. In the same way, thermal insulation is produced on the hexagonal tubes 18 in which the hot fluid flows, at the inlet zone for the cold fluid in the rectangular tubes 20. For the second example of FIG. 11, additional thermal insulation is produced on the hexagonal tubes 18 at the outlet zone, of the first section, for the cold fluid from the rectangular tubes 20. The aim of the thermal insulation is to avoid premature cooling of the hot fluid and/or premature heating of the cold fluid upstream of the active part of the exchanger where the electricity generation takes place.

The configurations shown in the cited figures are merely some possible and non-limiting examples of the invention, which by contrast incorporates form and design variants within the scope of those skilled in the art, as well as variations in dimensions and quantities of the thermoelectric modules within a generator.

The invention claimed is:

1. A thermoelectric module comprising:
   a central thermoelectric assembly of cylindrical tubular shape inside which a first cold fluid flows and outside which a hot fluid flows; and
   at least one peripheral thermoelectric assembly comprising:
      an outer face in contact with a second cold fluid, and
      an inner face positioned on a peripheral boundary surrounding the central thermoelectric assembly, said boundary defining a channel between said central and peripheral thermoelectric assemblies where the hot fluid flows.

2. The thermoelectric module as claimed in claim 1, further comprising a single peripheral thermoelectric assembly positioned continuously on the peripheral boundary.

3. The thermoelectric module as claimed in claim 1, wherein the central thermoelectric assembly is situated inside the peripheral thermoelectric assembly.

4. The thermoelectric module as claimed in claim 1, wherein said peripheral thermoelectric assembly of cylindrical tubular shape that is parallel and concentric with the central thermoelectric assembly.

5. The thermoelectric module as claimed in claim 1, wherein said central and peripheral thermoelectric assemblies are each formed by an alignment of thermoelectric elements of annular shape that are linked electrically to one another and able to generate an electric current under the action of a temperature gradient exerted between two of their faces.

6. The thermoelectric module as claimed in claim 1, wherein said channel inside which the hot fluid flows has an annular cross section.

7. The thermoelectric module as claimed in claim 1, wherein the channel in which the hot fluid flows comprises means for disrupting the flow of the hot fluid.

8. The thermoelectric module as claimed in claim 7, wherein said means for disrupting the flow of the hot fluid consist of fins that are positioned within the channel for the flow of the hot fluid and extend from the outer face of the central thermoelectric assembly and from the inner face of the peripheral thermoelectric assembly.

9. The thermoelectric module as claimed in claim 8, wherein said fins extending from the central and peripheral thermoelectric assemblies are positioned in a quincunx.

10. The thermoelectric module as claimed in claim 1, wherein the central and peripheral thermoelectric assemblies are linked electrically in parallel.

11. A thermoelectric device comprising an arrangement of a plurality of thermoelectric modules as claimed in claim 1.

12. The thermoelectric device as claimed in claim 11, wherein the thermoelectric modules are positioned in a line.

13. The thermoelectric device as claimed in claim 11, wherein the thermoelectric modules are positioned in a quincunx.

14. A thermoelectric generator comprising at least one thermoelectric device as claimed in claim 11.

* * * * *